United States Patent [19]
Roggenkamp

[11] 3,965,971
[45] June 29, 1976

[54] COOLING SYSTEM FOR SEMICONDUCTORS

[75] Inventor: George H. Roggenkamp, Salem, Va.

[73] Assignee: Eaton Corporation, Cleveland, Ohio

[22] Filed: June 27, 1974

[21] Appl. No.: 483,489

[52] U.S. Cl. ................................ 165/39; 165/41;
165/107; 357/82; 180/65 R; 174/15 R
[51] Int. Cl.² ........................................ F28D 15/00
[58] Field of Search .................. 180/68.5, 65, 54 A;
357/82; 317/100; 174/15 R, DIG. 5; 165/39,
80, 107, 47, 41

[56] References Cited
UNITED STATES PATENTS

| | | | |
|---|---|---|---|
| 2,163,744 | 6/1939 | Buchanan | 62/228 |
| 2,565,273 | 8/1951 | Shuler et al. | 180/65 R X |
| 3,725,566 | 4/1973 | Plizak | 174/DIG. 5 |
| 3,807,489 | 4/1974 | Minbiole et al. | 165/39 X |

*Primary Examiner*—Albert W. Davis, Jr.
*Attorney, Agent, or Firm*—Teagno & Toddy

[57] ABSTRACT

An SCR which controls the speed of a battery powered vehicle is liquid cooled by a closed circuit cooling system utilizing an oscillating pump, a heat exchanging reservoir, and an SCR mounting block. The SCR mounting block forms a fluid chamber when the SCR is mounted thereto. The heat exchanging reservoir is mounted to the vehicle chassis above the oscillating pump and is connected by tubing to both the pump and to the fluid chamber of the SCR mounting block to allow the pump to recirculate the liquid through the closed cooling system. The oscillating pump is connected to the battery of the vehicle through a chopper circuit to provide pulsating liquid flow from the pump in response to the pulsating D.C. signal from the chopper circuit. The pump thus circulates the heated liquid from the fluid chamber of the semiconductor mounting block to the heat exchanging reservoir where it is cooled and circulated back to the fluid chamber.

6 Claims, 4 Drawing Figures

COOLING SYSTEM FOR SEMICONDUCTORS

BACKGROUND OF THE INVENTION

1. Field of the Invention

The present invention relates to cooling systems for semiconductors generally and more particularly to cooling systems for power semiconductors of a battery powered vehicle.

2. Description of the Prior Art.

Battery powered vehicles such as electric lift trucks utilize power semiconductors such as SCR's (silicon controlled rectifiers) to control the application of battery power to the vehicle drive motor and hence to control the speed of the vehicle. The current through the semiconductors generate heat which must be dissipated to insure adequate life and trouble-free performance of the semiconductor and the vehicle generally and the vehicle drive system in particular. To dissipate this heat generated by the power semiconductors various cooling systems have been adopted.

A commonly accepted method of cooling the vehicle power semiconductors is to mount the semiconductors on solid heat sinks. These heat sinks are manufactured from materials such as copper, brass, or aluminum, which have a high heat transfer coefficient. The semiconductors are usually mounted in direct contact with the heat sinks and conduct heat to the heat sinks from which the heat is dissipated by natural convection from the surface of the heat sink. To increase the amount of heat convected from the heat sink the heat sink is sometimes formed to provide a finned external surface. This opens more area for convection heat transfer.

Nevertheless, whether the heat sink is finned or not, its placement in a relatively cool and open area of the vehicle is needed to assure proper heat dissipation. This placement requirement does not necessarily provide a compact drive control package since the cool area may be remote from the vehicle motor which is being controlled.

Since the vehicle is driven at different speeds, the power controlling semiconductor must handle different degrees of power transmission. A higher power level transmission requires a longer ON time for the semiconductor and consequently the semiconductor if self-heated to a greater degree and more heat must be removed therefrom to insure proper operation and life. A heat sink that is adequate for normal vehicle duty cycle heat dissipation may be inadequate to handle extended semiconductor controlled speed operation of the vehicle. Under such extended semiconductor controlled speed operation the semiconductor can overheat and fail. To prevent such semiconductor damage, present electric vehicles provide a thermistor which senses the temperature of the heat sink and cuts back the power to the semiconductor upon detecting such an overheating condition. To accomplish this a thermistor having a positive temperature coefficient electrically controls the gate frequency of the SCR and thereby provides a diminishing of the gate control frequency as the heat sink approaches danger levels. One undesirable feature of this system is that the vehicle does not travel at the speed dictated by the accelerator pedal position.

Liquid cooling of the heat sink would provide adequate heat transfer from the normal heat sink to allow the vehicle to operate under various extended speed conditions. As a concept, liquid cooling of semiconductors is disclosed in U.S. Pat. No. 3,400,543 issued to P. G. Ross. However, the adaption of a liquid cooling system to cool the power semiconductors of a battery driven electric vehicle presents problems which have not been solved to date by the prior art. Specifically, since the power source of an electric vehicle is D.C., the pump circulating the cooling fluid would have to operate from a D.C. power source to provide an economically feasible system. The use of available A.C. pump motors would require the use of expensive circuitry to convert the D.C. power to A.C. power. On the other hand, available D.C. pump motors are expensive or toublesome requiring intermittent brush replacement. A D.C. pump and motor would also require more space. As such the D.C. motor driven pump is also unacceptable as a component of a liquid cooling system for cooling power semiconductors of a battery driven vehicle.

SUMMARY OF THE INVENTION

The present invention solves the problems recited in the discussion of the prior art as well as other problems by providing an economical fluid cooling system for semiconductors which is easily powered from a D.C. power source.

This system utilizes an oscillating pump to circulate cooling fluid between a semiconductor mounting base, which acts as a semiconductor receptacle, and a fluid reservoir, which acts as a heat exchanger to dissipate the heat generated by the semiconductor and transferred to the cooling fluid. The oscillating pump is connected to a D.C. power source, such as is provided by the battery/ies of an electric vehicle, through a chopper circuit. This circuit intermittently transmits the D.C. power to the pump to power it thereby. The pump is basically a reciprocating check valve driven by the pump armature acting against a restoring spring. When the armature is energized the check valve moves fluid through the system and is restored to its original position when the power is terminated. As such the oscillating pump is ideally suited to be connected to the power battery/ies of an electric vehicle to circulate cooling fluid between the semiconductor mounting base and the heat exchanger reservoir.

The cooling system is easily mounted to the chassis of the electric vehicle. The reservoir heat exchanger is mounted to a chassis member in a relatively cool area of the vehicle. The oscillating pump is mounted below the level of the reservoir to insure priming of the pump. However, it need not be in the same area as the reservoir. This allows the pump and the chopper circuit to be mounted proximately to the main electrical components to facilitate electrical connection.

In view of the foregoing it will be seen that one aspect of the present invention is to provide a semiconductor cooling system which is driven from a D.C. power source.

Another aspect of the present invention is to provide a liquid cooling system for power semiconductors of a battery driven vehicle which system is easily powered by the vehicle battery.

Another aspect of the present invention is to provide a liquid cooling system for power semiconductors of a battery driven vehicle to allow the vehicle to maintain desired power transmission by the semiconductor under extended power demand conditions by the vehicle.

These and other aspects of the present invention will be more readily understood from a consideration of the following description of the preferred embodiment and the drawings.

DESCRIPTION OF THE SPECIFIC EMBODIMENT

Figure 1:
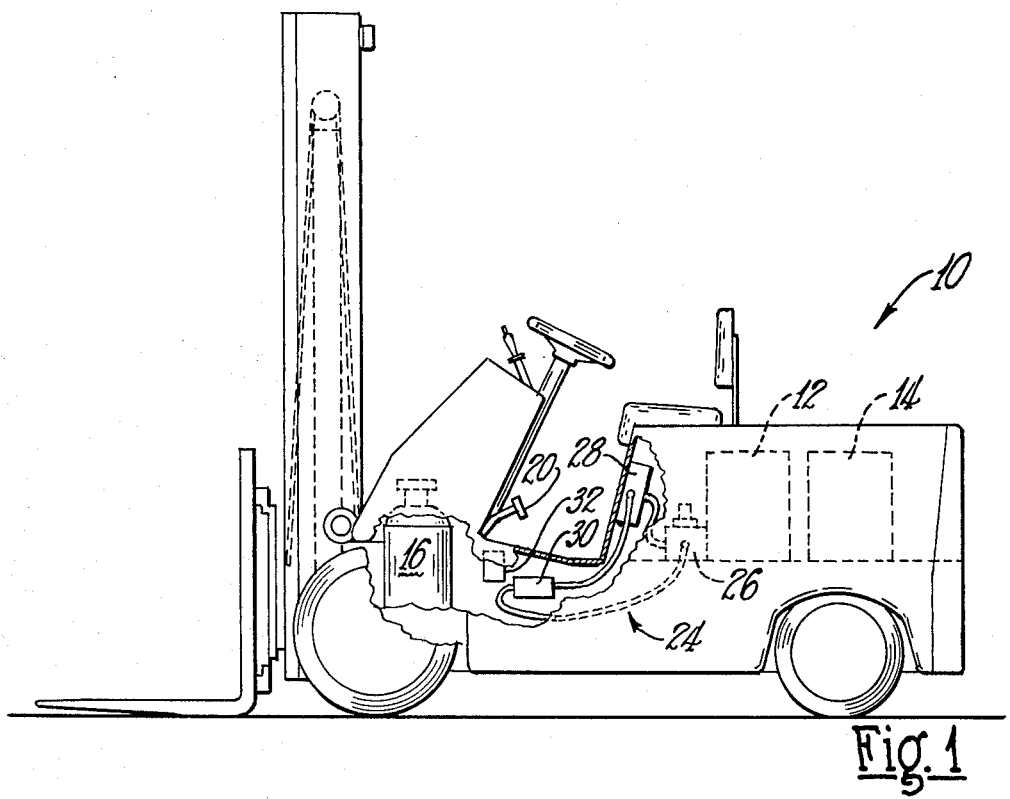
FIG. 1 is a partially cut-away drawing of a battery driven vehicle incorporating the present liquid cooling system.
Figure 2:
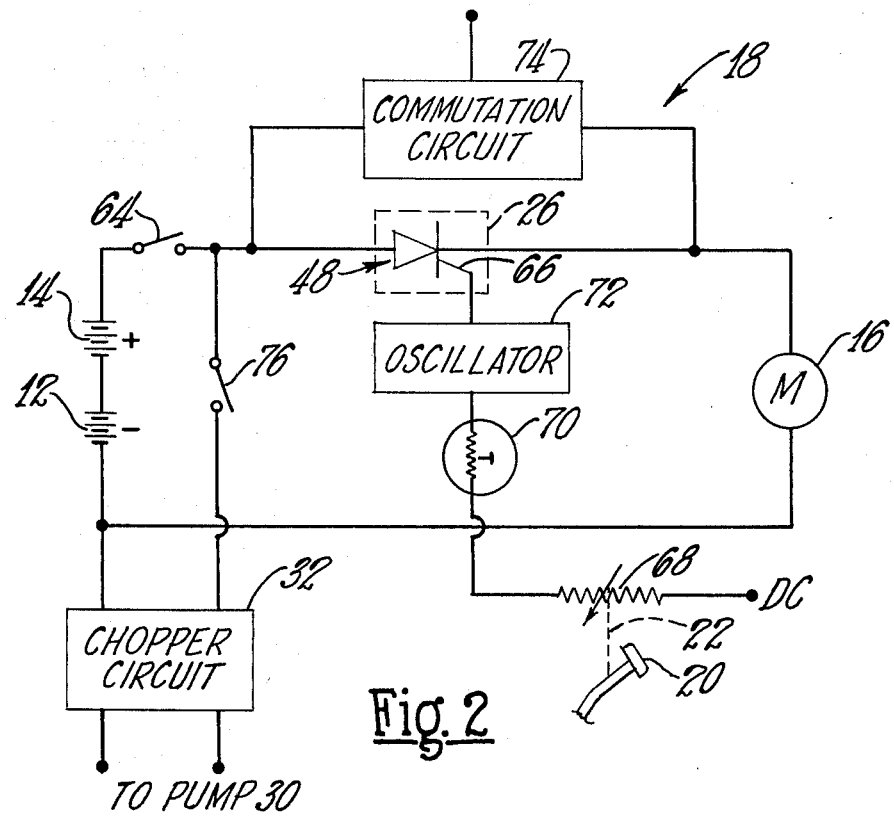
FIG. 2 is a schematic representation of the electrical power drive system of the FIG. 1 vehicle showing the liquid cooled semiconductor and the electrical connections for the pump of the present system.

Referring now to the drawings, a specific embodiment of the liquid cooling system is shown as adapted to a specific battery driven vehicle, namely a lift truck 10. As shown in FIG. 1 the lift truck 10 is powered by a pair of rechargeable batteries 12 and 14 which are normally series connected. The batteries 12 and 14 are electrically connected to the drive motor 16 through a drive control system 18, as is best seen in FIG. 2. The speed of the lift truck 10 is controlled by depressing an accelerator 20 which is mechanically linked to drive control system 18 by a linkage 22.

As the accelerator is depressed to a greater degree, more power is passed from the batteries 12 and 14 to the motor 16 causing the motor 16 to rotate faster and drive the vehicle 10 at an increased speed. When the vehicle 10 is driven at faster speeds, the drive control system 18 heats up to a greater degree since it is transmitting more electrical power to the motor 16. To dissipate this generated heat a liquid cooling system 24 is mounted within the vehicle 10 to recirculate the cooling liquid between a heat sink 26, to which the main control components of the drive system are mounted, and a pair of reservoir heat exchangers 28. A single larger reservoir heat exchanger could just as easily be used if there is room in the vehicle 10. The cooling liquid is recirculated by an oscillating pump 30.

As was discussed previously, the pump 30 must be adaptable to the power source of the vehicle 10, namely, it must be adaptable to the batteries 12 and 14. The oscillating pump 30 meets this requirement when it is utilized with a chopper circuit 32. As may be best seen with reference to FIG. 3, the oscillating pump 30 has an annular magnetic coil 34 which is intermittently energized by a D.C. power signal from the chopper circuit 32. When the coil 34 is energized, an armature 36 is drawn into the coil 34. The armature 36 is connected to a flexible check valve 38 which moves with the armature to extend a spring 40. When the coil 34 is deenergized, the spring 40 restores the armature 36 and the check valve 38 to a neutral position. The pulsating D.C. signal from the chopper circuit 32 thereby provides vibrating motion to the check valve 38 producing a vibrating pumping action from the pump 30. The chopper circuit is powered from a constant D.C. power source and provides approximately a 7.5 ms. on cycle and a 10 ms. off cycle. Thus the combination of the oscillating pump 30 and the chopper circuit 32 provides an economical and readily available pumping means for the semiconductor cooling system which is readily powered by the vehicle batteries 12 and 14.

Figure 3:
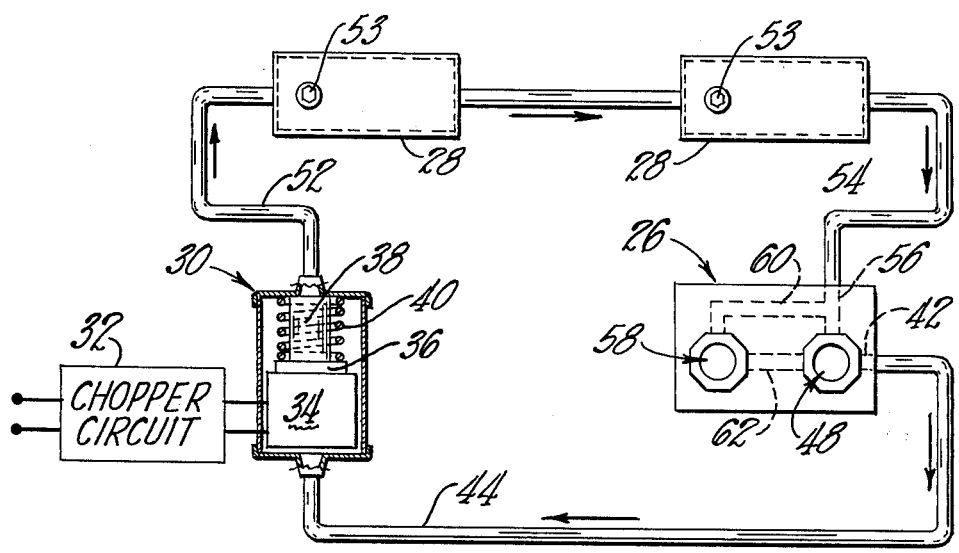
FIG. 3 is a schematic representation of the present liquid cooling system.
Figure 3A:
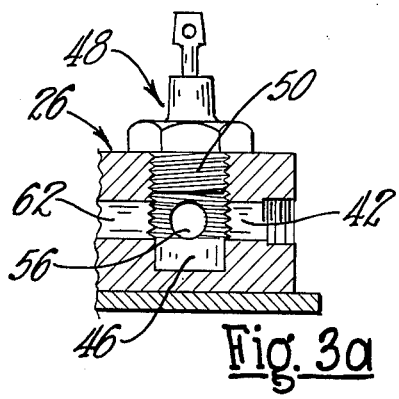
FIG. 3a is an expanded cut-away side view of the heat sink of FIG. 3.

With particular reference to FIGS. 3 and 3a it may be seen that the pump 30 provides circulation of cooling fluid between the reservoir heat exchangers 28 and the heat sink 26. The pump 30 is mounted below the reservoirs 28 to insure that the pump 30 will remain primed and will pump fluid immediately upon being energized. The suction side of the pump 30 is connected to a passage 42 in the heat sink 26 by flexible tubing 44 to draw fluid from a fluid chamber 46 formed in the heat sink 26. A main power control SCR 48 is sealably threaded into the heat sink 26 to form the fluid chamber 46. Alternatively the fluid chamber 46 could be formed under the SCR 48 without communicating with the SCR 48 but being proximate thereto to still provide adequate heat transfer from the SCR 48 to the cooling fluid. In operation the SCR generated heat is transferred to the liquid in the fluid chamber 46 mainly through a stem 50 of the SCR 48. This heated liquid is withdrawn by the pump 30 through the passage 42 and the tubing 44. The heated liquid is then discharged from the pressure side of the pump 30 to the reservoir 28 by way of flexible tubing 52.

The reservoirs 28 are made from a heat conductive material such as cast aluminum but could be any other material having a high heat transfer coefficient. Each reservoir has a removable filling port 53 through which the cooling system 24 is filled with fluid. The fluid may be water, anti-freeze, or any other suitable liquid. Although the present system uses two reservoirs, a single larger reservoir could just as easily be used. The reservoir or reservoirs could also be finned to increase heat transfer. Since the reservoirs are generally placed in a relatively cool area of the lift truck 10 which also offers good air circulation the heated liquid quickly dissipates the heat from the liquid to the ambient by convective heat transfer.

The cooled liquid is then forced from the reservoirs 28 by way of a flexible tube 54 to the heat sink 26. The tube 54 is connected to a passage 56 communicating with the fluid chamber 46 to provide cooling fluid thereto. Since the heat sink 26 may have provisions for mounting other semiconductors requiring cooling such as a semiconductor 58, a passage 60 is formed in the heat sink 26 to communicate the cooling fluid to the semiconductor 58. The fluid heated by semiconductor 58 is then evacuated through a passage 62 to the fluid chamber 46 and therefrom back to the pump 30 by way of passage 42 and the tubing 44.

Although a particular connection of the pump 30 to the reservoirs 28 and the heat sink 26 is described it will be understood that such connection between the pump 30, the reservoirs 28 and the heat sink 26 may be changed to other connections so long as a closed series connection of fluid flow is maintained therebetween.

Referring now to FIG. 2 it will be seen that the operation of the pump 30 and hence the operation of the liquid cooling system 24 is tied in with the vehicle 10 drive control system 18 and operates to cool the main drive control SCR 48.

The motor 16 circuit is series connected to the batteries 12 and 14 through the controlling SCR 48 and a vehicle ignition switch 64. Closing the ignition switch 64 connects the batteries 12 and 14 to both the motor 16 circuit and the pump 30 circuit.

The motor 16 circuit is initially in a non-conducting state since the battery voltage is insufficient to break down the SCR from its back biasing state and to do so requires the application of a control signal to a gate 66 of the SCR 48. This control signal is provided by a series connected circuit including a potentiometer 68, a thermistor 70, and an oscillator circuit 72 being connected to a D.C. power source. The potentiometer 68 is mechanically coupled to the accelerator 20 and establishes a D.C. control signal in proportion to the depression of the accelerator 20. This control signal is modified when necessary, as will be explained later, by the thermistor 70 and converted to an intermittent control signal by the oscillator 72. The oscillator 72 is a voltage to frequency converter that establishes a different frequency signal to the control gate 66 proportional to the voltage level applied from the potentiometer 68. The controlling SCR 48 is made conductive by the high level of the pulses of the frequency signal and is reverse biased by a commutation circuit 74 to shut off SCR 48 conduction during the low levels of the pulses. Thus the higher the frequency the greater the conduction time of the SCR 48 and the more power being transmitted from the batteries 12 and 14 to the motor 16. Of course, the greater the ON time of the SCR 48 the more heat it generates.

To insure that safe operating temperatures are not exceeded the thermistor 70 is mounted to sense the temperature of the heat sink 26. The thermistor 70 has a positive temperature coefficient and changes resistance in direct proportion to the temperature to which it is subjected. Therefore, as the thermistor 70 senses an increased heat sink 26 temperature it adds resistance to the gate 66 circuit of the SCR 48 to effect a power cut back thereto.

Without an effective cooling system being provided for the heat sink 26 this power cut back caused by the thermistor 70 causes problems. A vehicle 10 that is operated at full throttle 20 and maximum power transmission by the SCR 48 will begin to lose power or will start to slow down since the heat sink is unable to dissipate the heat generated by the SCR 48.

To alleviate this problem, the liquid cooling system 24 is incorporated into the lift truck 10. The cooling system 24 may be made to run continuously by connecting the chopper circuit 32 of the pump 30 directly to the batteries 12 and 14 through the ignition switch 64. This will insure sufficient cooling for the heat sink 26 under all power transmission levels including extended maximum power transmission by the SCR 48. Alternatively, a bimetal switch 76 could be series connected to the chopper circuit to power the pump 30 and actuate the cooling system 24 only upon maximum power transmission levels. The bimetal switch is mounted to sense the temperature of the heat sink 26 and would provide an open circuit condition until a predetermined temperature. This predetermined temperature would be one where the SCR 48 begins to approach its maximum operating temperature. The bimetal switch 76 would then close to provide a closed circuit thereby energizing the pump and cooling the heat sink 26.

From the foregoing it is seen that the present invention provides an economical liquid cooling system for power components of a lift truck 10 which is readily adaptable to the D.C. power source of the truck 10 and which prevents undesirable power cut backs in the truck 10. Certain modifications and changes will be apparent to those skilled in the art. As an example, the bimetal switch 76 could be replaced with a switching transistor which could control the energizing of the pump 30. The switching transistor would be operated by the resistance level of the thermistor 70. Such modifications and improvements are deleted herein for the sake of conciseness and readability but are intended to be within the scope of the claims of the present case.

I now claim:

1. In a battery powered vehicle:
   a heat sink mounted on said vehicle;
   a power semiconductor utilized to vary the speed of the vehicle mounted on said heat sink, said heat sink having a cavity formed therein to mount said power semiconductor, and forming a fluid chamber for maintaining cooling fluid in heat transfer communication with said semiconductor;
   heat exchanger means mounted on said vehicle for dissipating heat to the ambient;
   an oscillating pump mounted on said vehicle at a level below said heat exchanger means;
   tubing means for connecting the fluid chamber of said heat sink, said heat exchanger means, and said oscillating pump into a closed series path to thereby allow said oscillating pump to recirculate cooling fluid therethrough; and
   a chopper circuit electrically connected to the battery of said vehicle and mounted proximate to said oscillating pump to convert the constant D.C. signal of the vehicle battery to a pulsating D.C. signal, said oscillating pump being electrically connected to said chopper to be driven by the pulsating D.C. signal therefrom.

2. Apparatus as claimed in claim 1 including switch means for actuating said pump in response to a predetermined temperature being attained by said heat sink.

3. Apparatus as claimed in claim 2 wherein said switch means includes a bimetal switch mounted to sense said heat sink temperature and connecting said pump to the battery of the vehicle upon detecting a predetermined heat sink temperature.

4. Apparatus as claimed in claim 1 wherein said heat exchanger means includes a reservoir mounted to the main chassis of the vehicle.

5. Apparatus as claimed in claim 4 wherein said heat exchanger means includes a pair of reservoirs with one of said reservoirs mounted to the main chassis of the vehicle below the level of said oscillating pump, said one of said pair of reservoirs further having filling means for adding cooling fluid to the system.

6. Apparatus as claimed in claim 4 wherein said power semiconductor includes the main motor controlling SCR of the vehicle drive control.

* * * * *